United States Patent [19]
Koblitz et al.

[11] Patent Number: 5,396,193

[45] Date of Patent: Mar. 7, 1995

[54] FREQUENCY RESPONSE-COMPENSATED CIRCUIT

[75] Inventors: Rudolf Koblitz, Meylan, France; Steffen Lehr, Marbach, Germany

[73] Assignee: Deutsche Thomson-Brandt GmbH, Villingen-Schwenningen, Germany

[21] Appl. No.: 930,931

[22] Filed: Aug. 18, 1992

[30] Foreign Application Priority Data

Feb. 10, 1990 [DE] Germany .................. 40 04 135.2

[51] Int. Cl.⁶ .............................................. H03F 3/45
[52] U.S. Cl. ............................... 330/260; 330/262
[58] Field of Search ............... 330/262, 35, 19, 260, 330/292, 280, 281, 146, 141; 307/297

[56] References Cited

U.S. PATENT DOCUMENTS

| | | | |
|---|---|---|---|
| 3,432,763 | 3/1969 | Ingman | 330/140 |
| 3,582,689 | 6/1971 | Smith et al. | 307/297 |
| 3,679,986 | 7/1972 | Zaman, III | 330/281 |
| 3,984,780 | 10/1976 | Hsiao | 330/35 |
| 4,028,631 | 6/1977 | Ahmed | 330/19 |
| 4,152,667 | 5/1979 | Visser | 330/280 |
| 4,184,176 | 1/1980 | Sahara et al. | 330/292 |
| 4,234,853 | 11/1980 | Yamaguchi | 330/280 |
| 4,456,885 | 6/1984 | Nakagawa et al. | 330/281 |
| 4,502,017 | 2/1985 | Van de Plassche et al. | 330/292 |
| 4,517,525 | 5/1985 | Dijkmans et al. | 330/292 |
| 4,703,285 | 10/1987 | Woo | 330/292 |

FOREIGN PATENT DOCUMENTS 2476936 8/1981 France ............... H03F 3/21

OTHER PUBLICATIONS

"Transistors in High Frequency Amplifiers"; Guggenbuhl et al, P265 +, from Electronic @ Radio Engineer, Jul. 1957.

Primary Examiner—Raymond A. Nelli
Attorney, Agent, or Firm—Joseph S. Tripoli; Peter M. Emanuel

[57] ABSTRACT

A frequency compensated circuit includes a frequency compensation component and a negative feedback loop for feeding an output signal to the circuit input terminal. The circuit input terminal also receives a compensation signal from the frequency compensation component. A controlled system provides an output signal to the input terminal. A controlled current is supplied to the controlled system to increase the output voltage and the compensation signal from the compensation component can be substantially lower than it is in the prior art type of systems.

8 Claims, 3 Drawing Sheets

FREQUENCY RESPONSE-COMPENSATED CIRCUIT

This is a continuation of PCT application PCT/EP 90/02221 filed Dec. 18, 1990 by Rudolf Koblitz and Steffan Lehr and titled "Frequency Response-Compensated Circuit".

This invention is directed to a frequency response compensated circuit for a control loop. The direct voltage gain of an operational amplifier, which is constructed as shown in FIG. 1, has an output voltage $V_{out}$ where: $V_{out} = V_{in} * R_1/R_{10}$. Internally, such an integrated operational amplifier mainly consists of transistors and resistors. Coupling capacitances, so-called parasitic capacitances, exist between the connecting wires and base, collector, emitter of the transistors and the ground substrate. These parasitic capacities cause progressively reduced inverse feedback in the higher frequency ranges so that the high frequency gain compared with the direct voltage gain, markedly diminishes. The phase response also changes with increasing frequency. Above a certain frequency, for example, 10 MHz, the phase shift exceeds 180 degrees and uncontrollable oscillations result, because the gain is still larger than one. These oscillations are avoided by installing a frequency response compensation capacitor at a suitable point within the operational amplifier. This capacitor causes the shift to stay within a certain frequency range of 90 degrees and the gain diminishes more rapidly. When the phase shift at higher frequencies ultimately reaches 180 degrees the gain has already fallen to less than one and the disturbing oscillations do not occur. The higher the gain is, the greater the frequency response which must be compensated. However, the capacitor used to provide the frequency response compensation within integrated circuits requires a relatively larger chip surface, for example, 0.001 sq mm/pF. That means a capacitor of 1,000 pF would require an area of 1 sq mm.

A regulating circuit which is frequency response compensated by means of a capacitor is described in U.S. Pat. No. 3,984,780. In order to achieve high regulating accuracy, the internal amplification, and thus also the capacitor must be large.

It is an object of the present invention to generate precise currents using a regulating circuit and to reduce the capacitance required for the frequency response compensation capacitor in the regulating circuit.

The invention is described with reference to the drawings in which.

Figure 1:
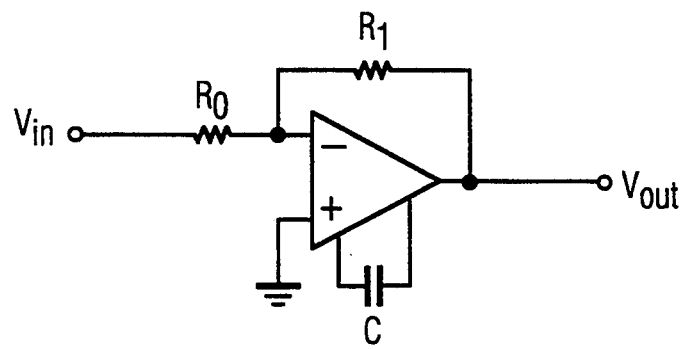
FIG. 1 is a prior art operational amplifier.

The wiring of a negative feedback operational amplifier is shown in FIG. 1. The gain of the amplifier is: $V_{out} = V_{in} * R_1/R_{10}$.

Figure 2:
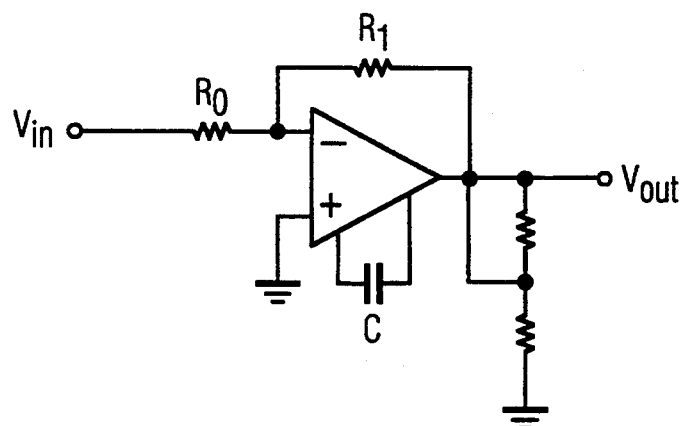
FIG. 2 is a prior art operational amplifier using reduced inverse feedback.

The wiring of a negative feedback operational amplifier having reduced inverse feedback is shown in FIG. 2. In FIGS. 1 and 2 capacitor C is the capacitor used for the frequency response compensation component.

Figure 3:
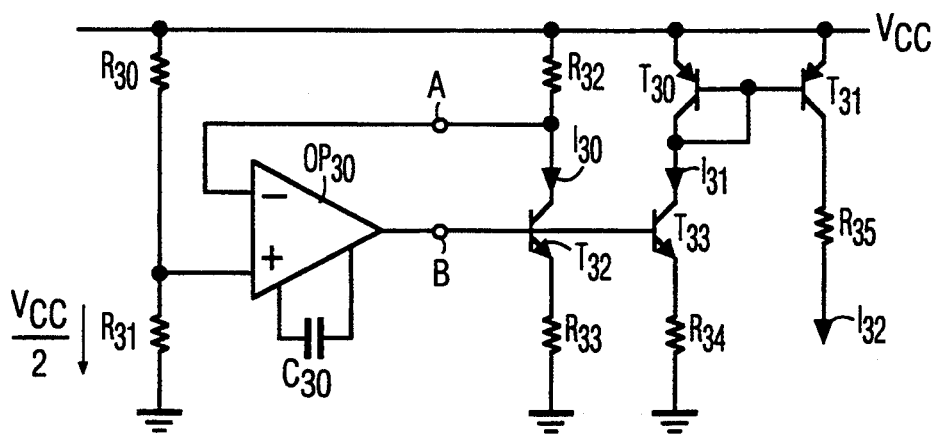
FIG. 3 is a prior art circuit for generating a precise current with an operational amplifier in the control loop.

In the prior art circuit shown in FIG. 3, resistors $R_{30}$ and $R_{31}$ have the same resistance value. The voltage drop across resistors $R_{30}$ and $R_{31}$ is one half of the input voltage $V_{CC}$ because the non-inverted input terminal of the operational amplifier $OP_{30}$, which is connected to the junction of $R_{30}$ and $R_{31}$, is high in comparison to resistors $R_{30}$ and $R_{31}$. Resistor $R_{32}$ is a reference resistor with a resistance value of, for example, 50 kOhm. Transistor $T_{30}$ is a current mirror. The junction of resistor $R_{32}$ and the collector of transistor $T_{32}$, is connected to the inverting input terminal of operational amplifier $OP_{30}$. Accordingly, a reference current $I_{30} = (V_{CC}/2)/R_{32}$ flows into the collector of $T_{32}$. An equal current $I_{31} = I_{30}$ builds up at the collector of transistor $T_{30}$. A current $I_{32} = (R_{35}/R_{32}) * (V_{CC}/2)$ builds up through resistor $R_{35}$ by using the current mirror function of transistor $T_{30}$ and the resistor $R_{35}$.

The capacitor $C_{30}$ of the operational amplifier $OP_{30}$ serves as the frequency response compensation component to regulate the reference current $I_{30}$. Capacitor $C_{30}$ must have a relatively high value and therefore a large chip area is required. The currents $I_{30}$, $I_{31}$, $I_{32}$ are determined by the supply voltage $V_{CC}$. Because the supply voltage $V_{CC}$ can be very precise, the currents $I_{30}$ and through $I_{32}$ are correspondingly precise.

Figure 4:
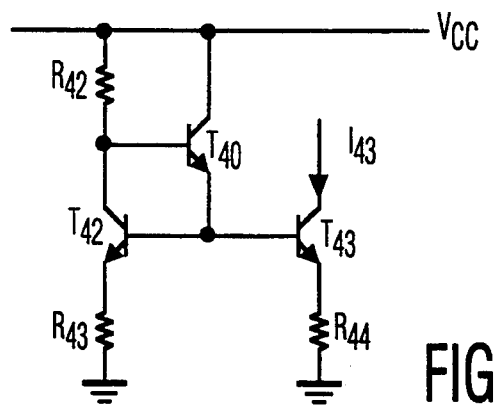
FIG. 4 is a prior art circuit for generating an approximately precise current.

FIG. 4 shows another prior art circuit which is used to generate accurate currents. Resistor $R_{42}$ is a reference resistor and transistor $T_{40}$ is a current mirror. The resulting current $I_{43}$ is $I_{43} = (V_{CC} - 2*VBE)/R_{42}$. The base emitter voltage VBE is temperature-dependent and therefore the current $I_{43}$ is, likewise, temperature-dependent. Voltage VBE changes by about 200 mV in the temperature range 0-100 degrees C. However, the circuit complexity is substantially reduced compared to the FIG. 3 circuit. In particular, the chip area needed for the capacitor $C_{30}$ is substantially reduced for the FIG. 4 circuit.

Figure 5:
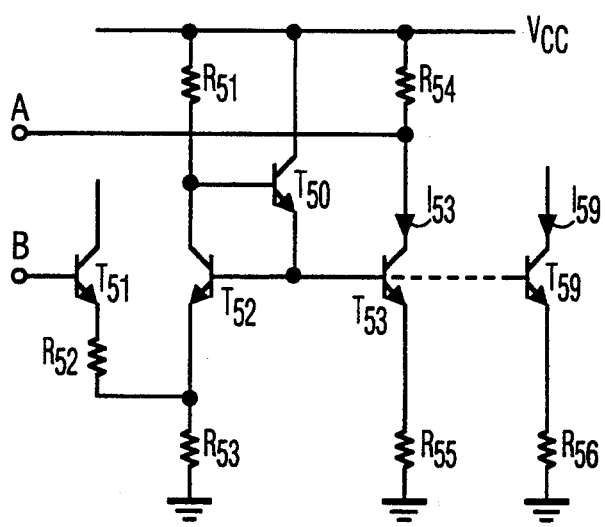
FIG. 5 is a preferred embodiment of inventive circuit for generating a precise current.

FIG. 5 shows a preferred embodiment of a circuit which generates accurate currents but has: a substantially reduced chip area for the frequency response compensation capacitor. The circuitry to the left of the connection points A and B in FIG. 3, which consists of the resistors $R_{30}$ and $R_{31}$, the operational amplifier $OP_{30}$ and the capacitor $C_{30}$, is connected to points A and B of FIG. 5. Resistors $R_{51}$ and $R_{54}$ have the same value and are reference resistors. Transistor $T_{50}$ is a current mirror and the reference current is current $I_{53}$. Additional exactly equal reference currents, for example, $I_{59}$, build up at additional transistors, for example $T_{59}$, the base terminals of which are connected to the base of transistor $T_{53}$. The resistors $R_{51}$, $R_{53}$, $R_{55}$ in FIG. 5 correspond to the resistors $R_{42}$, $R_{43}$, $R_{44}$, respectively in FIG. 4 and the transistors $T_{50}$, $T_{52}$ $T_{53}$ in FIG. 5 correspond to the transistors $T_{40}$, $T_{42}$, $T_{43}$, respectively in FIG. 4. Accordingly, the reference current $I_{53}$ is preset to correspond to the reference current $I_{43}$. The fine adjustment is assumed by the operational amplifier $OP_{30}$, which is connected to the terminals A and B. The $OP_{30}$ must only readjust the temperature-dependent variations caused by VBE variations of transistor 53. Accordingly, the range of control of $OP_{30}$, and hence also, the inverse feedback (as described with reference to. FIG. 2), is substantially reduced. This reduction occurs because the output of $OP_{30}$ is not directly connected to the emitter of $T_{52}$, instead the connection is made via the emitter follower $T_{51}$ and a resistor $R_{52}$. The resistor $R_{52}$ is large and has, for example, a value $R_{52}=10 * R_{53}$. Accordingly, capacitor $C_{30}$ can be reduced by a factor of 10 and, for example, have a value of 5 pF instead of 50 pF.

The three additional transistors and the three additional resistors require a chip area which is, for example, approximately equal to the area of a 2 pF capacitor. It can be seen that because of the reduction of capacitor C from 50 pF to 5 pF, a substantial reduction in the chip area required for the whole regulating circuit is realized, despite the increased number of components, when compared to the FIG. 3 circuit, and the accuracy of the reference current $I_{53}$ as high as that of current $I_{30}$ in FIG. 3.

Figure 6:
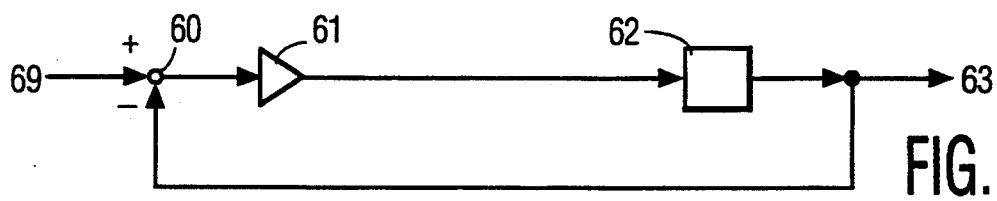
FIG. 6 is a prior art representation of a control loop.
Figure 7:
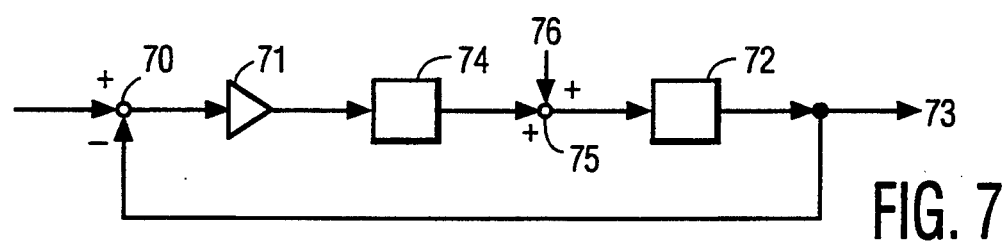
FIG. 7 is a representation of a control loop according to the invention.
Figure 8:
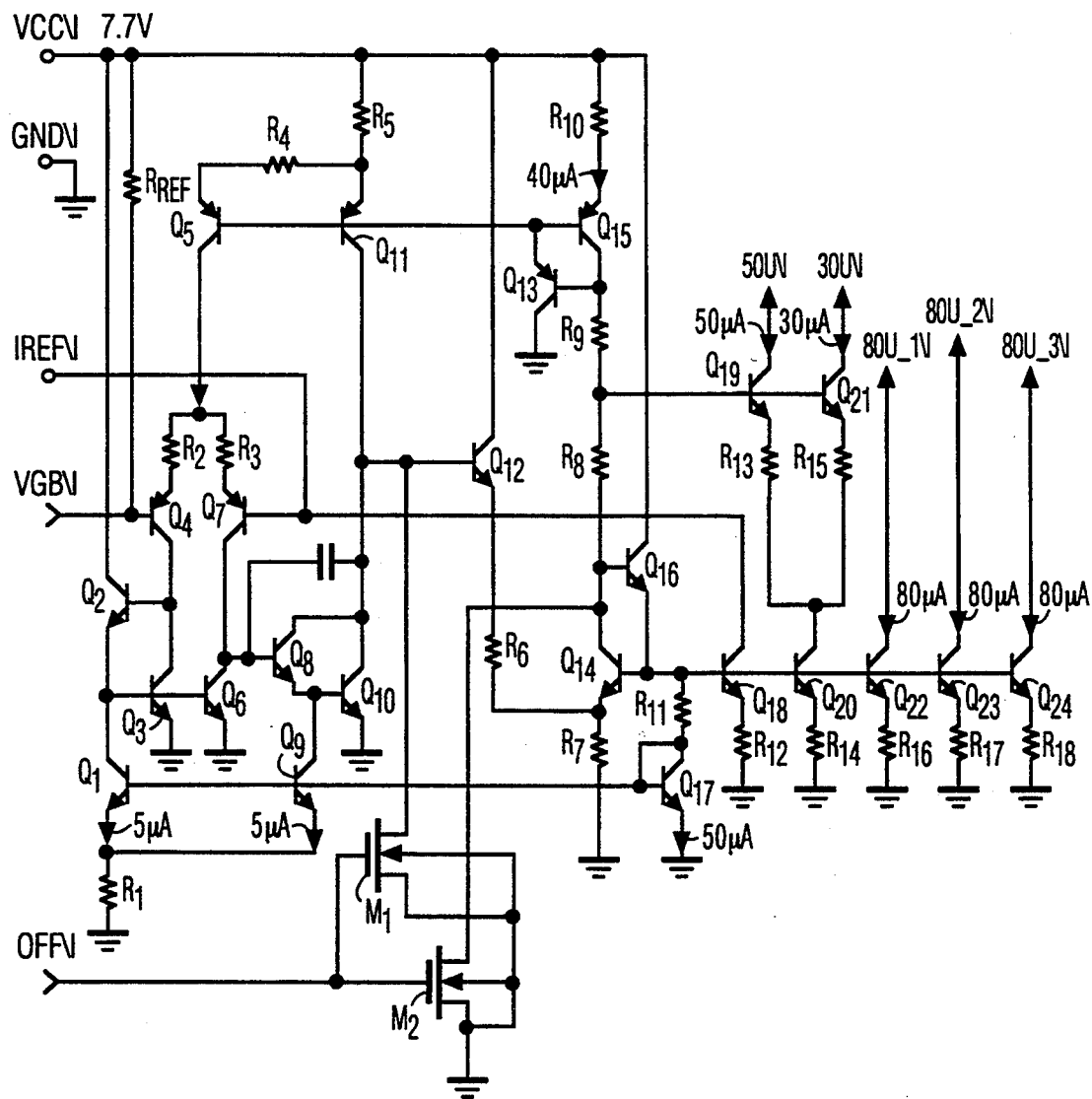
FIG. 8 is circuit diagram of a temperature compensated power supply.

The advantage of the invention can be appreciated from FIG. 6 and FIG. 7. FIG. 6 shows a prior art control loop. The desired voltage value at 69 is fed to a subtraction point 60. The feedback (actual) voltage value at 63 is subtracted from the desired voltage value at 69. The result is fed via an error amplifier 61 to the control system 62 which supplies the feedback value as an output signal. Thus, capacitor C of the operational amplifier $OP_{30}$ must compensate for the full current variation.

FIG. 7 shows a control loop according to the invention. The desired voltage value at 79 is fed to a subtraction point 70. The feedback voltage value at 73 is subtracted from the desired value at 79. The result is fed to an addition point 75 via an error amplifier 71 and a multiplier 74. At the addition point 75 a preadjustment control value 76 is added to the voltage from multiplier 74 and the sum fed to the control system 72, which supplies the feedback value as an output signal. The gain of the amplifier 71 is reduced by the addition of the preadjustment control value 76. This happens in the multiplier 74 through multiplication using a transmission value k; where k is less than one, for example, $k=0.1 \ldots 0.5$. The frequency response compensation in the error amplifier 71 can be advantageously decreased by a factor of $1/k$ through the reduction in the error gain.

The circuit shown in FIG. 18 supplies a current of 80 micro-amperes at each of the output terminals 80-1/I, 80OU-2/I and 8OU-3/I, a current of 50 micro-amperes at the output terminal 5OU/I and a current of 30 micro-amperes at the output terminal 30U/I. A reference resistor $R_{REF}$ is connected between the terminals $V_{CC}/I$ and $I_{REF}/I$. If reference resistor $R_{REF}$ is not used the temperature compensation for the VBE variations must be somewhat increased. The transmission value K is then also correspondingly somewhat higher. Transistor $Q_{12}$ corresponds to transistor $T_{51}$, resistor $R_6$ corresponds to resistor $R_{52}$, $R_8/R_9$ correspond to $R_{51}$, $Q_{16}$ corresponds to $T_{50}$, $Q_{14}$ corresponds to $T_{52}$, $R_7$ corresponds to $R_{53}$, the reference resistor $R_{REF}$ corresponds $R_{54}$, $Q_{18}$ corresponds to $T_{53}$, $R_{12}$ corresponds to $R_{55}$, $Q_{24}$ and $R_{18}$ correspond to $T_{59}$ and $R_{56}$, respectively. The base terminals of $Q_4$ and $Q_7$ correspond to the input terminals of $OP_{30}$, the collector terminals of $Q_{10}$ and $Q_{11}$ correspond to the output terminal of $OP_{30}$ and the capacitor $C_1$ corresponds to the capacitor $C_{30}$. Terminal GND/I is the ground terminal. A reference voltage of 1.2 V is connected to terminal VBG/I and the above-mentioned outputs are switched by the terminal OFF/I.

Components $Q_{12}$, $Q_{14}$, $Q_{16}$, $R_6$, $R_8$ and $R_9$ are additional components compared to the circuit shown in FIG. 3. However, a substantial saving of chip area is realized by the substantial reduction in the physical size of capacitor $C_1$.

We claim:

1. Apparatus comprising:
   a first source of a first reference signal;
   an amplifier having first input coupled to said first source of said first reference signal, a second input and an output;
   a frequency compensation capacitor coupled to said amplifier for preventing oscillations of said amplifier;
   an output circuit;
   said amplifier being coupled in a forward path between said first source and an output of said forward path;
   a feedback path coupled between said output of said forward path and said second input of said amplifier;
   a second source of a second reference signal coupled to said forward path between the output of said amplifier and the output of said forward path; and
   means coupled between said output of said amplifier and said second input of said amplifier for reducing the loop gain of the combination of said forward path and said feedback path.

2. The apparatus recited in claim 1, wherein:
   said means for reducing the loop gain is coupled between said output of said amplifier and said output of said forward path.

3. The apparatus recited in claim 2, wherein:
   said second source is coupled to said means for reducing the loop gain.

4. The apparatus recited in claim 3, wherein:
   said means for reducing said loop gain includes a , resistive voltage divider including first and second resistors.

5. The apparatus recited in claim 4, wherein:
   said second source is a source of a reference current (T50, T52, R51 or Q14, Q16, R8, R9) and is coupled to said second resistor of said resistive voltage divider.

6. The apparatus recited in claim 5, wherein:
   said source of current includes a first transistor having a collector electrode coupled to a source of voltage, a base electrode coupled to said source of voltage through a resistor, and a emitter electrode; and a second transistor having a collector electrode coupled to said base electrode of said first transistor, a base electrode coupled to said emitter electrode of said first transistor, and an emitter electrode coupled to said second resistor.

7. The apparatus recited in claim 6, wherein:
   said means for reducing said loop gain included an emitter-follower amplifier preceding said resistive voltage divider.

8. The apparatus recited in claim 1, wherein:
   said amplifier comprises an operational amplifier.

* * * * *